(12) United States Patent
Lee et al.

(10) Patent No.: US 9,356,261 B2
(45) Date of Patent: May 31, 2016

(54) LIGHT EMITTING DEVICE WITH LIGHT PATH CHANGING STRUCTURE

(71) Applicant: ELECTRONICS AND TELECOMMUNICATIONS RESEARCH INSTITUTE, Daejeon (KR)

(72) Inventors: Jeong Ik Lee, Gyeonggi-do (KR); Jin Woo Huh, Daejeon (KR); Hye Yong Chu, Daejeon (KR); Doo-Hee Cho, Daejeon (KR); Jun-Han Han, Daejeon (KR); Jin Wook Shin, Incheon (KR); Jaehyun Moon, Seoul (KR); Joo Hyun Hwang, Seoul (KR); Chul Woong Joo, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/609,611

(22) Filed: Jan. 30, 2015

(65) Prior Publication Data
US 2015/0140708 A1    May 21, 2015

Related U.S. Application Data

(62) Division of application No. 13/478,919, filed on May 23, 2012, now Pat. No. 8,975,649.

(30) Foreign Application Priority Data

Jul. 25, 2011    (KR) .................. 10-2011-0073512

(51) Int. Cl.
| H01L 21/00 | (2006.01) |
| H01L 51/56 | (2006.01) |
| H01L 51/52 | (2006.01) |
| H01L 51/00 | (2006.01) |

(52) U.S. Cl.
CPC ............ *H01L 51/56* (2013.01); *H01L 51/0096* (2013.01); *H01L 51/5212* (2013.01); *H01L 51/5234* (2013.01); *H01L 51/5268* (2013.01); *H01L 51/5275* (2013.01)

(58) Field of Classification Search
CPC . H01L 51/56; H01L 51/0096; H01L 51/5234; H01L 51/5268; H01L 51/5275; H01L 51/5212
USPC ................ 438/22, 25, 26, 27, 29, 46, 47, 956
See application file for complete search history.

(56) References Cited

U.S. PATENT DOCUMENTS

| 8,067,888 B2 | 11/2011 | Wu |
| 2006/0175965 A1 | 8/2006 | Lim |
| 2010/0060149 A1 | 3/2010 | Song et al. |
| 2010/0244667 A1* | 9/2010 | Pan et al. ...................... 313/504 |
| 2013/0015486 A1* | 1/2013 | Sekine et al. ................... 257/98 |

FOREIGN PATENT DOCUMENTS

| JP | WO2011/125390 A1 * | 10/2011 |
| KR | 102006009052 A | 8/2006 |
| KR | 102010003098 A | 3/2010 |

* cited by examiner

*Primary Examiner* — A. Sefer
*Assistant Examiner* — Dilinh Nguyen
(74) *Attorney, Agent, or Firm* — Rabin & Berdo, P.C.

(57) ABSTRACT

The inventive concept provides light emitting devices and methods of manufacturing a light emitting device. The light emitting device may include a transparent substrate including a first region and a second region, a first transparent electrode disposed on a first surface of the transparent substrate, a second transparent electrode facing and spaced apart from the first transparent electrode, an organic light emitting layer disposed between the first and second transparent electrodes, an assistant electrode disposed between the first and second transparent electrodes and selectively masking the second region, and a light path changing structure disposed on a second surface of the transparent substrate and selectively masking the second region.

4 Claims, 10 Drawing Sheets

LIGHT EMITTING DEVICE WITH LIGHT PATH CHANGING STRUCTURE

CROSS-REFERENCE TO RELATED APPLICATIONS

This application is a division of U.S. application Ser. No. 13/478,919, filed on May 23, 2012. U.S. application Ser. No. 13/478,919 claims priority under 35 U.S.C. §119 to Korean Patent Application No. 10-2011-0073512. Each of the identified applications is incorporated by reference in its entirety herein.

BACKGROUND

The inventive concept relates to light emitting devices and methods of manufacturing the same and, more particularly, to organic light emitting devices and methods of manufacturing the same.

An electronic industry, which communicates information to people from various devices, is very attractive in a modern industry society developed to an information age. This tendency is expected to be maintained for quite a long time. Particularly, in a display field corresponding to a man-machine interface, various researches have been conducted for displaying sophistication and color that can satisfy visual sense of people and be closer to nature.

Generally, a display is widely used to a television, a monitor, and a mobile phone. However, light, wide, fast, and high resolution displays have been increasingly demanded with the development of a technique.

Additionally, the display industry pursues small size, lightness, and thinness of the displays by using a thin film and demands the high resolution of the displays. Organic light emitting devices have been studied for realizing the displays having the high resolution. Particularly, researches have been conducted for improving light extraction efficiency and uniformity of the organic light emitting devices.

SUMMARY

Embodiments of the inventive concept may provide light emitting devices capable of improving light extraction efficiency and uniformity.

Embodiments of the inventive concept may also provide methods of manufacturing the light emitting device.

According to some embodiments of the inventive concepts, a light emitting device may include: a transparent substrate including a first region and a second region; a first transparent electrode disposed on a first surface of the transparent substrate; a second transparent electrode facing and spaced apart from the first transparent electrode; an organic light emitting layer disposed between the first and second transparent electrodes; an assistant electrode disposed between the first and second transparent electrodes, the assistant electrode selectively masking the second region; and a light path changing structure disposed on a second surface of the transparent substrate, the light path changing structure selectively masking the second region.

In some embodiments, the light path changing structure may include a micro lens array.

In other embodiments, the light path changing structure may include a pattern formed at the transparent substrate in the second region.

In still other embodiments, the pattern formed at the transparent substrate may have concave-curved surfaces.

In yet other embodiments, the light path changing structure may include an optical dispersion layer.

In yet still other embodiments, the optical dispersion layer may include nano-particles.

In yet still other embodiments, the assistant electrode may include a metal which light does not pass through and which has a resistance lower than that of the first transparent electrode.

According to other embodiments of the inventive concepts, a method of manufacturing a light emitting device may include: forming a first transparent electrode on a first surface of a transparent substrate including a first region and a second region; forming an assistant electrode selectively masking the second region on the first transparent electrode; forming an organic light emitting layer covering the first transparent electrode and the assistant electrode; forming a second transparent electrode on the organic light emitting layer; and forming a light path changing structure selectively masking the second region on a second surface of the transparent substrate.

In some embodiments, forming the light path changing structure may include: fixing a detachable micro lens array on a transfer substrate; and bonding the micro lens array to the second surface of the transparent substrate in the second region.

In other embodiments, forming the light path changing structure may include: selectively etching the second surface of the transparent substrate in the second region to form a pattern including concave-curved surfaces.

In still other embodiments, forming the light path changing structure may include: forming an optical dispersion layer on the second surface of the transparent substrate in the second region.

BRIEF DESCRIPTION OF THE DRAWINGS

The inventive concept will become more apparent in view of the attached drawings and accompanying detailed description.

DETAILED DESCRIPTION OF THE EMBODIMENTS

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept.

Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, embodiments of the inventive concept will be described in detail with reference to the drawings.

Light Emitting Device

First Embodiment

Figure 1:
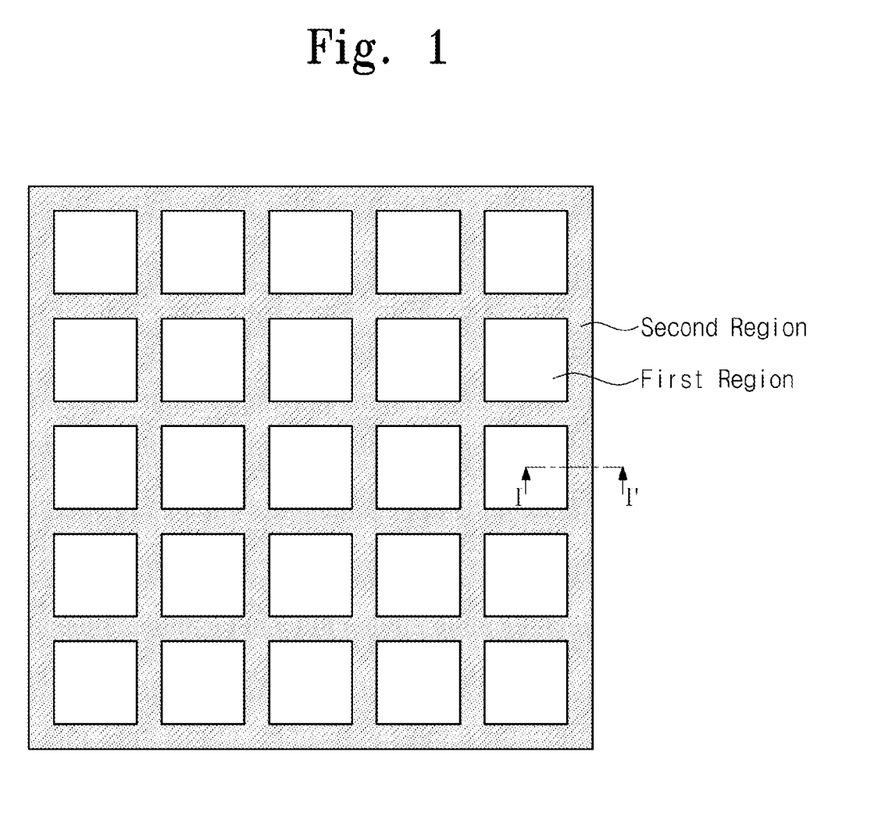
FIG. 1 is a plan view illustrating a light emitting device according to embodiments of the inventive concept.
Figure 2A:
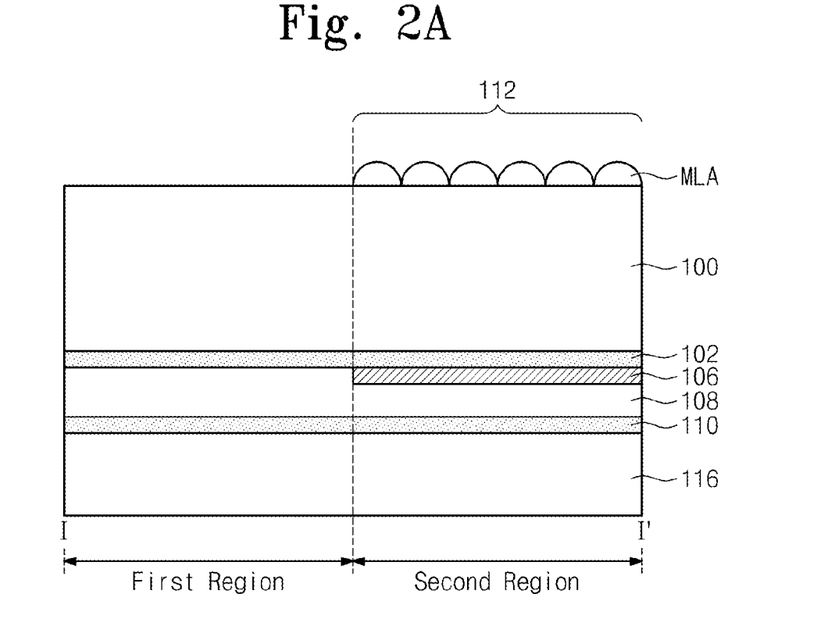
FIG. 2A is a cross-sectional view illustrating a light emitting device according to some embodiments of the inventive concept.
Figure 2B:
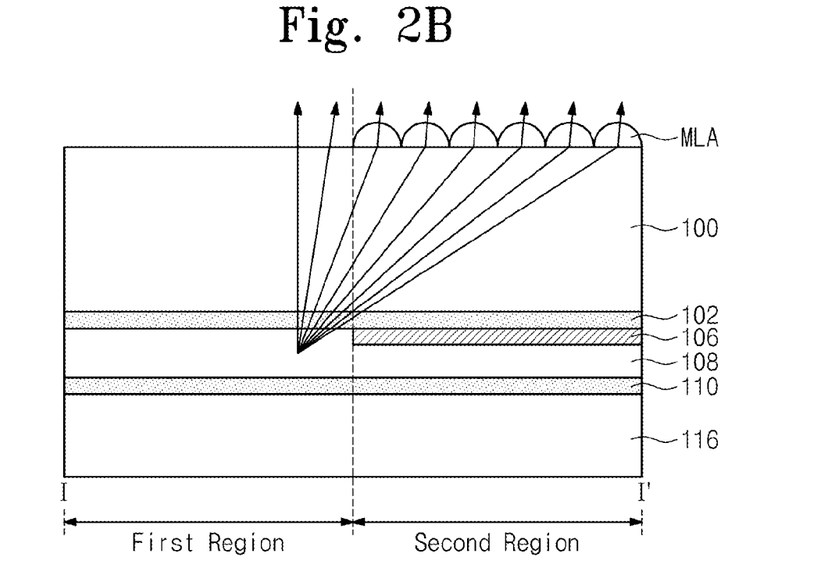
FIG. 2B is a cross-sectional view illustrating a path of light generated from a light emitting device according to some embodiments of the inventive concept.

FIG. 1 is a plan view illustrating a light emitting device according to embodiments of the inventive concept. FIG. 2A is a cross-sectional view illustrating a light emitting device according to some embodiments of the inventive concept. FIG. 2A a cross-sectional view taken along a line I-I' of FIG. 1. FIG. 2B is a cross-sectional view illustrating a path of light generated from a light emitting device according to some embodiments of the inventive concept.

Referring to FIGS. 1 and 2A, a light emitting device may include a transparent substrate 100, a first transparent electrode 102, a second transparent electrode 110, an organic light emitting layer 108, an assistant electrode 106, and a light path changing structure 112.

Referring to FIG. 1, the light emitting device may include a first region and a second region. The first region may correspond to a light transmission region and the second region may correspond to a light non-transmission region. The first region may be surrounded by the second region in a plan view. For example, the first region may have a quadrilateral shape and the second region may have a mesh-shape surrounding the first region when the light emitting device is viewed form a top view.

Referring to FIGS. 1 and 2A, the first and second transparent electrodes 102 and 110, the organic light emitting layer 108, and the transparent substrate 100 may completely cover the first and second regions. But, the assistant electrode 106 and the light path changing structure 112 may mask the second region selectively.

Referring to FIG. 2A, the transparent substrate 100 may be a glass substrate or a plastic substrate. The first transparent electrode 102 may be disposed on a first surface of the transparent substrate 100. The light path changing structure 112 may be disposed on a second surface of the transparent substrate 100 of the second region.

The first transparent electrode 102 may be formed of indium tin oxide (ITO) or indium zinc oxide (IZO) having excellent light transmittance. The first transparent electrode 102 may function as an anode supplying holes into the organic light emitting layer 108.

The second transparent electrode 110 may face one surface of the first transparent electrode 102 and be spaced apart from the one surface of the first transparent electrode 102. The second transparent electrode 110 may be formed of a metal thin film having light transmittance and a low work function of about 4.5 eV or less. For example, the second transparent electrode 110 may be formed of aluminum (Al), silver (Ag), molybdenum (Mo), and/or copper (Cu). The second transparent electrode 110 may function as a cathode supplying electrons into the organic light emitting layer 108.

The organic light emitting layer 108 may be disposed between the first and second transparent electrodes 102 and 110. In some embodiments, one surface of the organic light emitting layer 108 may include a first portion in contact with the first transparent electrode 102 in the first region, and a second portion spaced apart from the first transparent electrode 102 in the second region. In other words, the one surface of the organic light emitting layer 108 may have a stepped shape due to the first and second portions thereof. Another surface of the organic light emitting layer 108 may be fully in contact with the second transparent electrode 110.

The organic light emitting layer 108 may correspond to an organic electro luminescence layer. The organic light emitting layer 108 may include at least one layer generating light. Even though not shown in detail in the drawings, in some embodiments, the organic light emitting layer 108 may include a hole-transport layer, a light emitting layer, and an electron-transport layer. The light emitting layer may include a plurality of light emitting layers including a blue light emitting layer, a green light emitting layer, and a red light emitting layer.

The assistant electrode 106 may be disposed between the first and second transparent electrodes 102 and 110. In some embodiments, the assistance electrode 106 may be disposed between the organic light emitting layer 108 and the first transparent electrode 102 in the second region. In other words, the assistant electrode 106 may be disposed between the first transparent electrode 102 of the second region and the second portion of the one surface of the organic light emitting layer 108 which constitutes the stepped shape. The organic light emitting layer 108 may be in contact with the first transparent electrode 102 in the first region and the assistant electrode 106 in the second region.

The assistant electrode 106 may be formed of a metal having a resistance lower than that of the first transparent electrode 102. Additionally, the assistant electrode 106 may be formed of a metal which light does not pass through. For example, the assistant electrode 106 may be formed of chromium (Cr). The assistant electrode 106 may improve non-uniformity of luminance which may be caused by voltage drop of the light emitting device.

The light path changing structure 112 may be disposed on the second surface of the transparent substrate 100. Here, the light path changing structure 112 may selectively mask the second region. In some embodiment, the light path changing structure 112 may include a micro lens array MLA. In some embodiments, the micro lens array MLA may be arranged to mask the second region.

Referring to FIG. 2B, the light path changing structure 112 may change a path of light which is emitted from the organic light emitting layer 108 and then passes through the transparent substrate 100.

Since the light path changing structure 112 is selectively applied to only the second region in which the assistant electrode 106 is disposed, the light path changing structure 112 may not influence a light-transmittance of the light emitting device. A part of the light outputted from the transparent substrate 100 may be laterally lost by total reflection. However, the part of the light may be laterally lost may proceed toward the front of the light emitting device due to the light path changing structure 112. Thus, a light output efficiency of the light emitting device may be improved by about 10% to about 20%.

Additionally, the light emitting device may further include a sealing substrate 116 covering the second transparent electrode 110. The sealing substrate 116 may perform a function that protects the light emitting device.

An operation method of the light emitting device will be described briefly. A voltage may be applied between the first and second transparent electrodes 102 and 110. Thus, for example, electrons provided from the second transparent electrode 110 functioning as the cathode may be combined with holes provided from the first transparent electrode 102 functioning as the anode, so that excitons may be formed. The excitons may be radiatively recombined to generate light.

Light Emitting Device

Second Embodiment

Figure 3A:
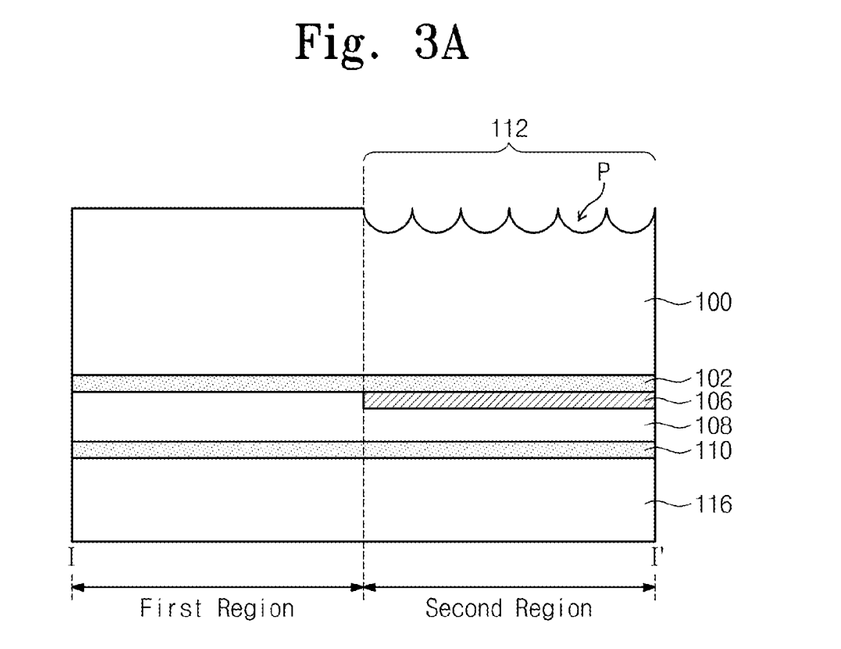
FIG. 3A is a cross-sectional view illustrating a light emitting device according to other embodiments of the inventive concept.
Figure 3B:
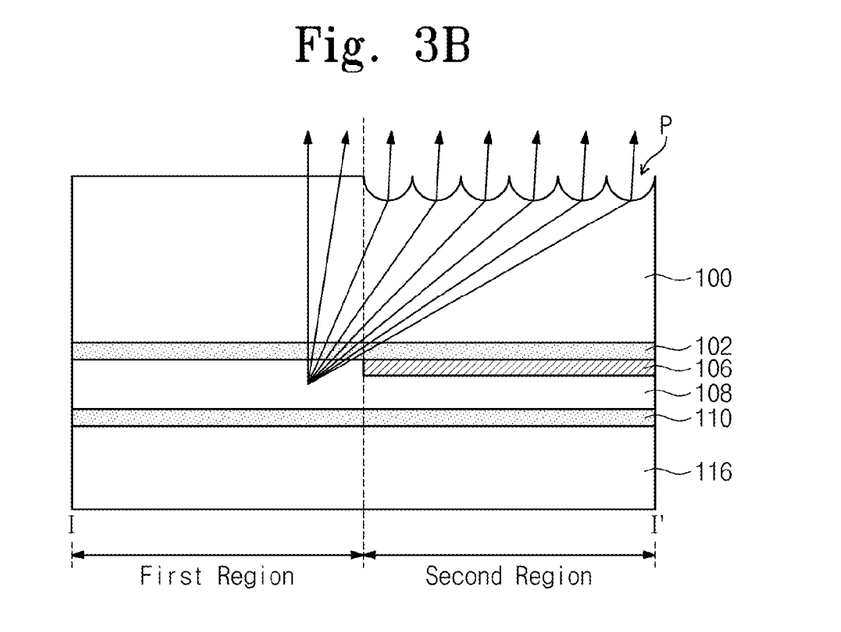
FIG. 3B is a cross-sectional view illustrating a path of light generated from a light emitting device according to other embodiments of the inventive concept.

FIG. 3A is a cross-sectional view illustrating a light emitting device according to other embodiments of the inventive concept. FIG. 3A is a cross-sectional view taken along a line I-I' of FIG. 1. FIG. 3B is a cross-sectional view illustrating a path of light generated from a light emitting device according to other embodiments of the inventive concept.

Referring to FIGS. 1 and 3A, a light emitting device may include a transparent substrate 100, a first transparent electrode 102, a second transparent electrode 110, an organic light emitting layer 108, an assistant electrode 106, a light path changing structure 112, and a sealing substrate 116.

The transparent substrate 100 may include a first surface in contact with the first transparent electrode 102 and a second surface opposite to the first surface.

In some embodiment, the light path changing structure 112 may include a pattern P which is formed at the transparent substrate 100 of the second region. In some embodiments, the pattern P may have concave-curved surfaces lower than the second surface of the transparent substrate 100 of the first region.

Referring to FIG. 3B, the light path changing structure 112 may change a path of light which is emitted from the organic light emitting layer 108 and then passes through the transparent substrate 100.

Since the light path changing structure 112 including the pattern P is selectively applied to only the second region in which the assistant electrode 106 is disposed, the light path changing structure 112 may not influence a light-transmittance of the light emitting device. Additionally, the part of the light may be laterally lost by the total reflection may proceed toward the front of the light emitting device due to the light path changing structure 112. Thus, a light output efficiency of the light emitting device may be improved by about 10% to about 20%.

The transparent substrate 100, the first transparent electrode 102, the second transparent electrode 110, the organic light emitting layer 108, the assistant electrode 106, and the sealing substrate 116 may be substantially the same as the transparent substrate 100, the first transparent electrode 102, the second transparent electrode 110, the organic light emitting layer 108, the assistant electrode 106, and the sealing substrate 116 which are described with reference to FIG. 2A. Thus, descriptions thereof will be omitted.

Light Emitting Device

Third Embodiment

Figure 4A:
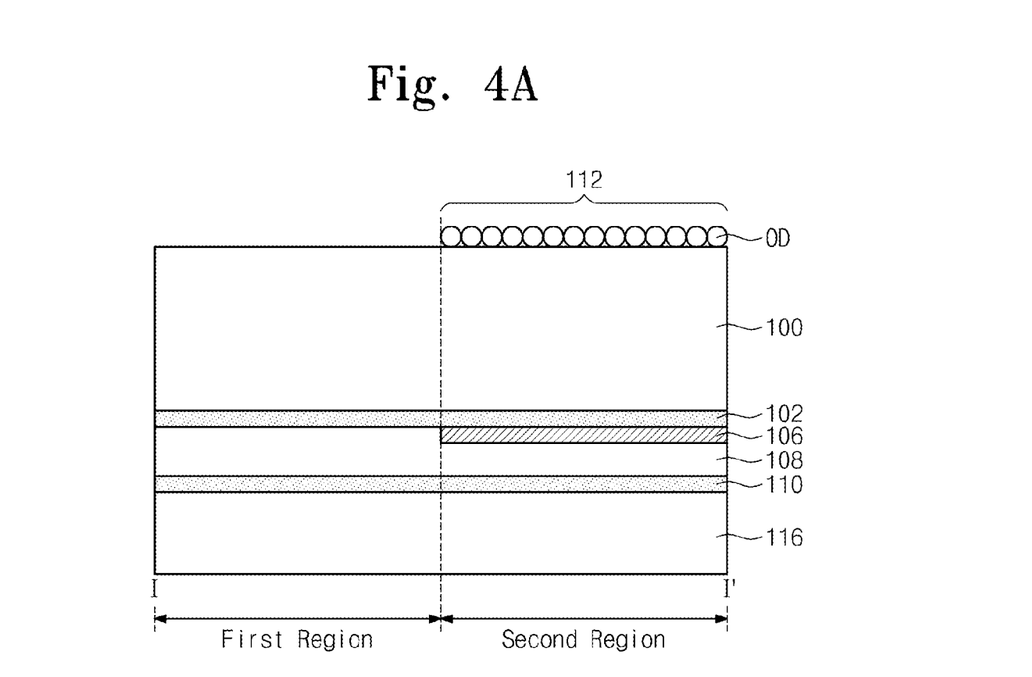
FIG. 4A is a cross-sectional view illustrating a light emitting device according to still other embodiments of the inventive concept.
Figure 4B:
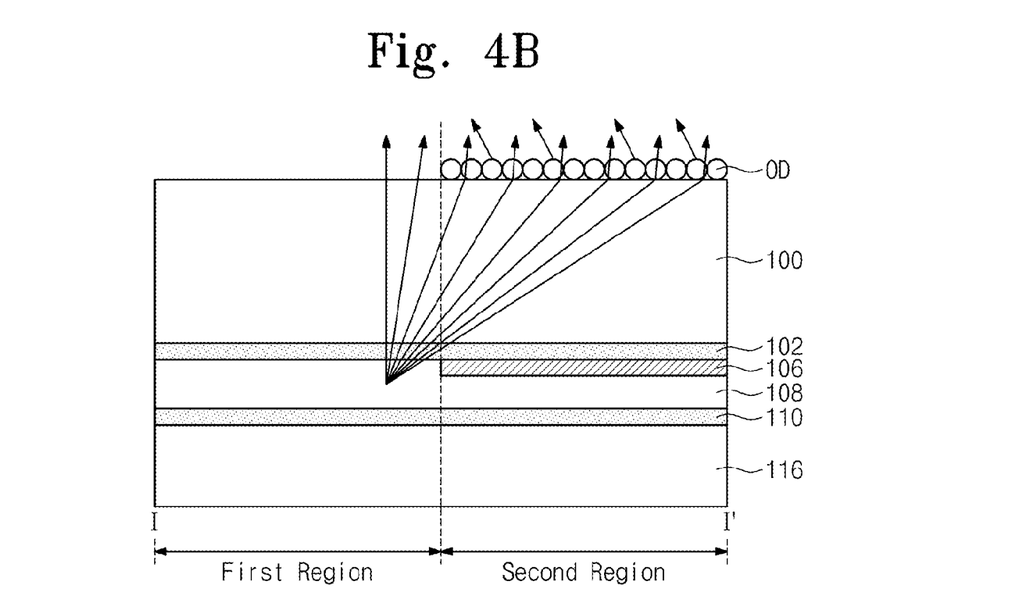
FIG. 4B is a cross-sectional view illustrating a path of light generated from a light emitting device according to still other embodiments of the inventive concept.

FIG. 4A is a cross-sectional view illustrating a light emitting device according to still other embodiments of the inventive concept. FIG. 4A is a cross-sectional view taken along a line I-I' of FIG. 1. FIG. 4B is a cross-sectional view illustrating a path of light generated from a light emitting device according to still other embodiments of the inventive concept.

The transparent substrate 100 may include a first surface in contact with the first transparent electrode 102 and a second surface opposite to the first surface.

In some embodiments, the light path changing structure 112 may include an optical dispersion layer OD masking the transparent substrate 100 of the second region. The optical dispersion layer OD may include nano-particles.

Referring to FIG. 4B, the light path changing structure 112 may change a path of light which is emitted from the organic light emitting layer 108 and then passes through the transparent substrate 100.

Since the light path changing structure 112 including the optical dispersion layer OD is selectively applied to only the second region in which the assistant electrode 106 is disposed, the light path changing structure 112 may not influence a light-transmittance of the light emitting device. Additionally, the part of the light may be laterally lost by the total reflection may proceed toward the front of the light emitting device due to the light path changing structure 112. Thus, a light output efficiency of the light emitting device may be improved by about 10% to about 20%.

The transparent substrate 100, the first transparent electrode 102, the second transparent electrode 110, the organic light emitting layer 108, the assistant electrode 106, and the sealing substrate 116 may be substantially the same as the transparent substrate 100, the first transparent electrode 102, the second transparent electrode 110, the organic light emitting layer 108, the assistant electrode 106, and the sealing substrate 116 which are described with reference to FIG. 2A. Thus, descriptions thereof will be omitted.

Method of Manufacturing Light Emitting Device

First Embodiment

FIGS. 5A to 5G are cross-sectional views illustrating a method of manufacturing a light emitting device according to some embodiments of the inventive concept.

Figure 5A:
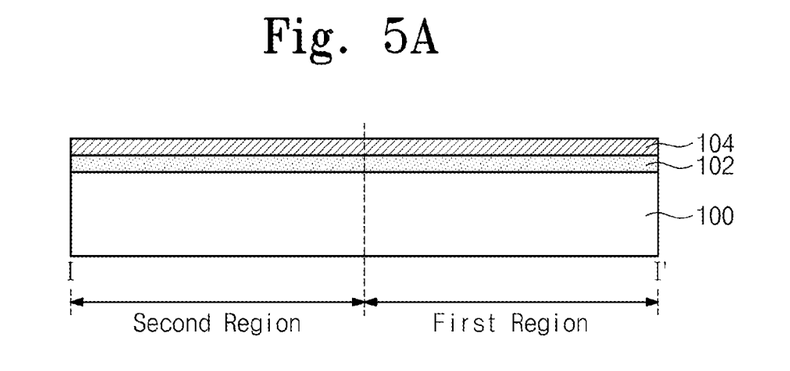
FIGS. 5A to 5G are cross-sectional views illustrating a method of manufacturing a light emitting device according to some embodiments of the inventive concept.

Referring to FIG. 5A, a first transparent electrode 102 and an assistant electrode layer 104 may be sequentially stacked on a first surface of a transparent substrate 100.

The transparent substrate 100 may include a first region and a second region. The first region may correspond to a light transmission region and the second region may correspond to a light non-transmission region. The first transparent electrode 102 and the assistant electrode layer 104 may be formed to completely cover the first surface of the transparent substrate 100.

The first transparent electrode 102 may be formed of an ITO layer and/or an IZO layer. The assistant electrode layer 104 may include a metal such as chromium (Cr).

Figure 5B:
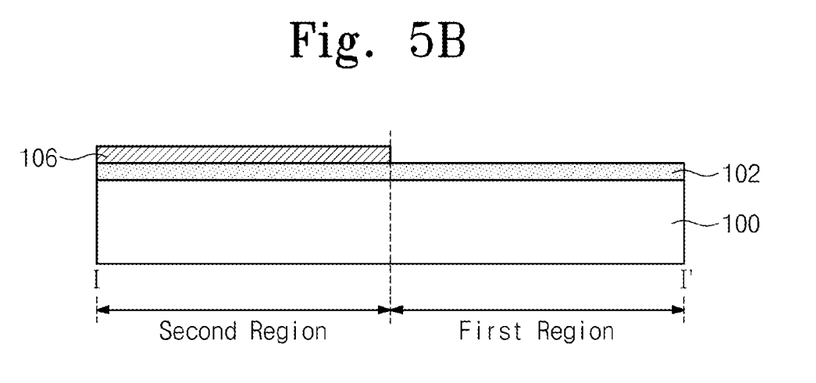

Referring to FIG. 5B, the assistant electrode layer 104 may be selectively etched to form an assistant electrode 106 masking the second region. At this time, the first transparent electrode 102 of the first region may be exposed.

Figure 5C:
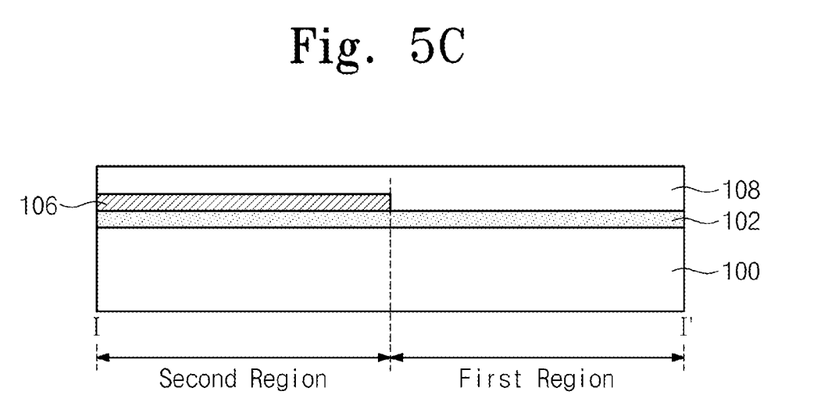

Referring to FIG. 5C, an organic light emitting layer 108 may be formed on the first transparent electrode 102 which the assistant electrode 106 is formed on. The organic light emitting layer 108 may be formed by a thermal evaporation process.

Even though not shown in detail in the drawings, a hole-transport layer, a light emitting layer, and a electrode-transport layer may be sequentially stacked to form the organic light emitting layer 108. Additionally, the light emitting layer may include a plurality of light emitting layers including a blue light emitting layer, a green light emitting layer, and a red light emitting layer.

Figure 5D:
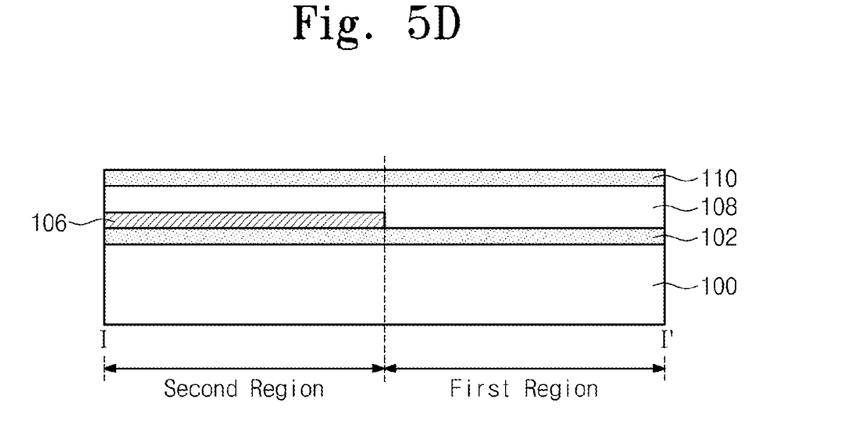

Referring to FIG. 5D, a second transparent electrode 110 may be formed on the organic light emitting layer 108. The second transparent electrode 110 may include a metal thin film having light transmittance and a low work function of about 4.5 eV or less. For example, the second transparent electrode 110 may be formed of aluminum (Al), silver (Ag), molybdenum (Mo), and/or copper (Cu).

Figure 5E:
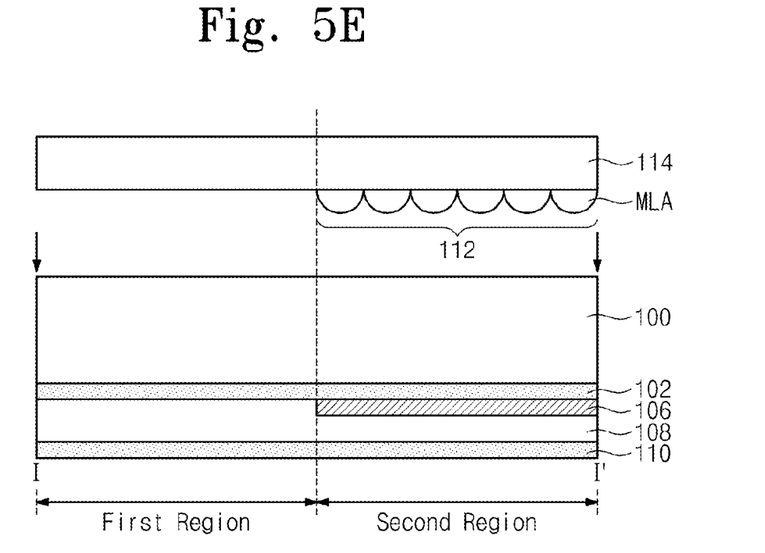

Referring to FIG. 5E, a transfer substrate 114 including a micro lens array MLA bonded on one surface thereof may be prepared.

The micro lens array MLA may be fixed to the transfer substrate 114 by an adhesive layer which is detachable by heat. Additionally, the micro lens array MLA may be disposed to be aligned with the second region.

Figure 5F:
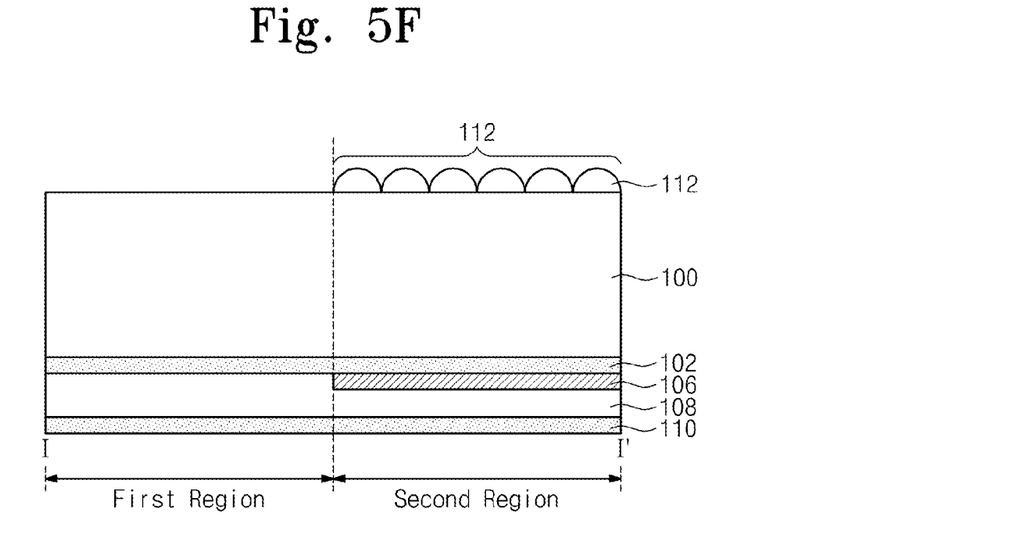

Referring to FIG. 5F, the micro lens array MLA may be fixed on a second surface of the transparent substrate 100 in the second region, thereby forming a light path changing structure 112. The second surface of the transparent substrate 100 may be opposite to the first surface thereof.

In some embodiments, the light path changing structure 112 may be formed in a film-shape including the micro lens array MLA.

Since the light path changing structure 112 including the micro lens array MLA is selectively applied to only the second region in which the assistant electrode 106 is disposed, the light path changing structure 112 may not influence a light-transmittance of the light emitting device. Additionally, the part of the light may be laterally lost by the total reflection may proceed toward the front of the light emitting device by the light path changing structure 112. Thus, a light output efficiency of the light emitting device may be improved by about 10% to about 20%.

Figure 5G:
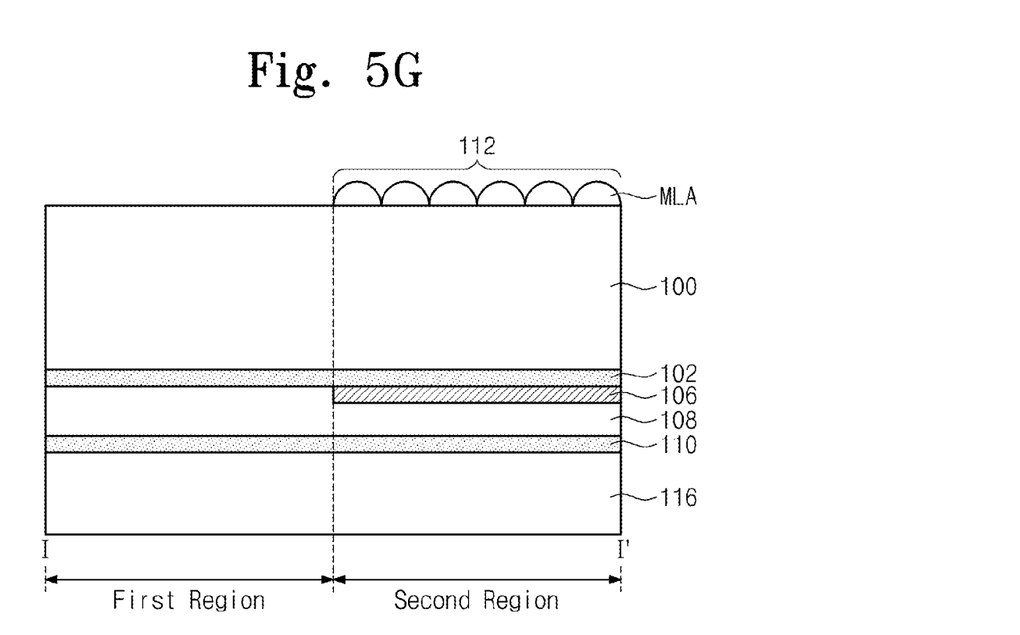

Referring to FIG. 5G, a sealing substrate 116 may be formed to cover the second transparent electrode 110.

In more detail, the second transparent electrode 110 may include a first surface in contact with the organic light emitting layer 108 and a second surface opposite to first surface. The sealing substrate 116 may be formed on the second surface of the second transparent electrode 110.

Method of Manufacturing Light Emitting Device

Second Embodiment

FIGS. 6A to 6D are cross-sectional views illustrating a method of manufacturing a light emitting device according to other embodiments of the inventive concept.

Figure 6A:
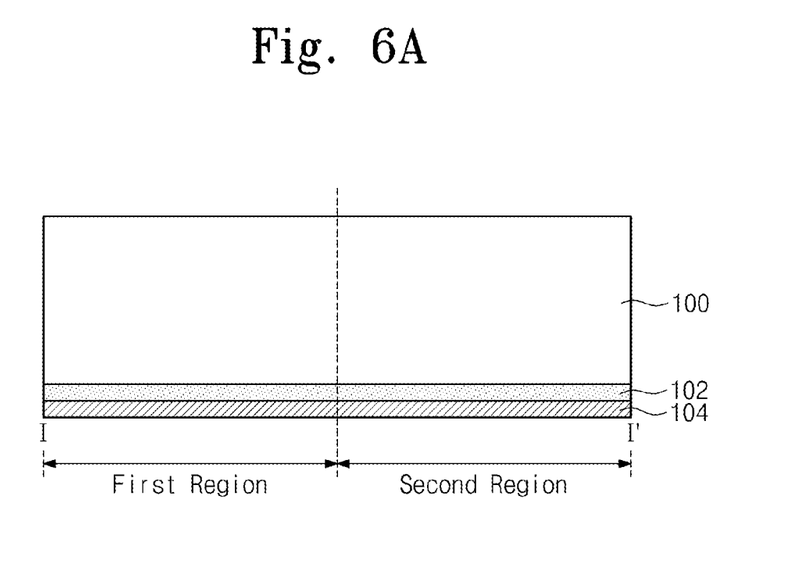
FIGS. 6A to 6D are cross-sectional views illustrating a method of manufacturing a light emitting device according to other embodiments of the inventive concept.

Referring to FIG. 6A, a transparent substrate 100 may include a first surface and a second surface opposite to the first surface. A first transparent electrode 102 and an assistant electrode layer 104 may be sequentially formed on the first surface of the transparent substrate 100. The transparent substrate 100 may include a first region corresponding to a light transmission region and a second region corresponding to a light non-transmission region.

Figure 6B:
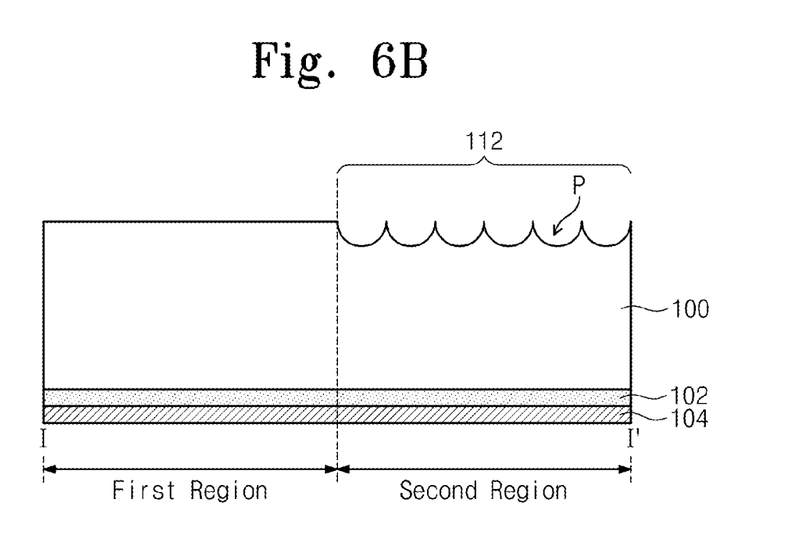

Referring to FIG. 6B, the second surface of the transparent substrate 100 in the second region may be selectively etched to form a pattern P having concave-curved surfaces lower than the second surface of the transparent substrate 100 in the first region. Thus, a light path changing structure 112 having the pattern P may be formed. The transparent substrate 100 may be etched by a wet etching process.

Figure 6C:
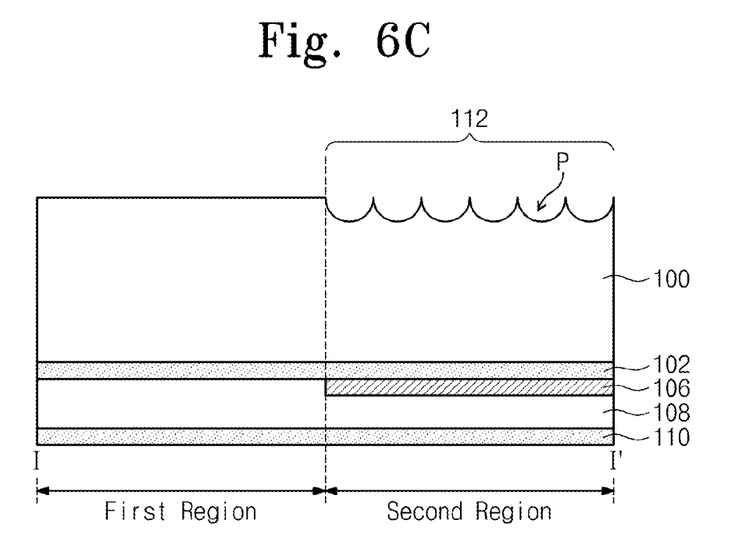

Referring to FIG. 6C, an assistant electrode 106, an organic light emitting layer 108, and a second transparent electrode 110 may be formed on the first surface of the transparent substrate 100 which the first transparent electrode 102 is formed on.

In more detail, the assistant electrode layer 104 on the first transparent electrode 102 may be etched to form the assistant electrode 106 selectively masking the second region of the transparent substrate 100. The organic light emitting layer 108 and the second transparent electrode 110 may be sequentially formed to cover the assistant electrode 106 and the first transparent electrode 102.

Figure 6D:
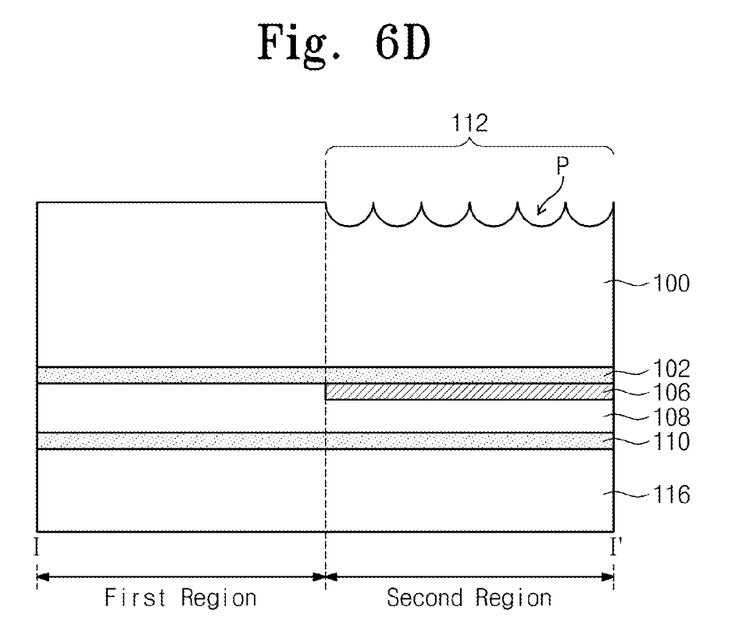

Referring to FIG. 6D, a sealing substrate 116 may be formed to cover the second transparent electrode 110. In more detail, the second transparent electrode 110 may include a first surface in contact with the organic light emitting layer 108 and a second surface opposite to first surface. The sealing substrate 116 may be formed on the second surface of the second transparent electrode 110.

Thus, the light emitting device including the light path changing structure 112 may be manufactured. Since the light path changing structure 112 including the pattern P is selectively applied to only the second region in which the assistant electrode 106 is disposed, the light path changing structure 112 may not influence a light-transmittance of the light emitting device. Additionally, the part of the light may be laterally lost by the total reflection may proceed toward the front of the light emitting device by the light path changing structure 112. Thus, a light output efficiency of the light emitting device may be improved by about 10% to about 20%.

Method of Manufacturing Light Emitting Device

Third Embodiment

Figure 7A:
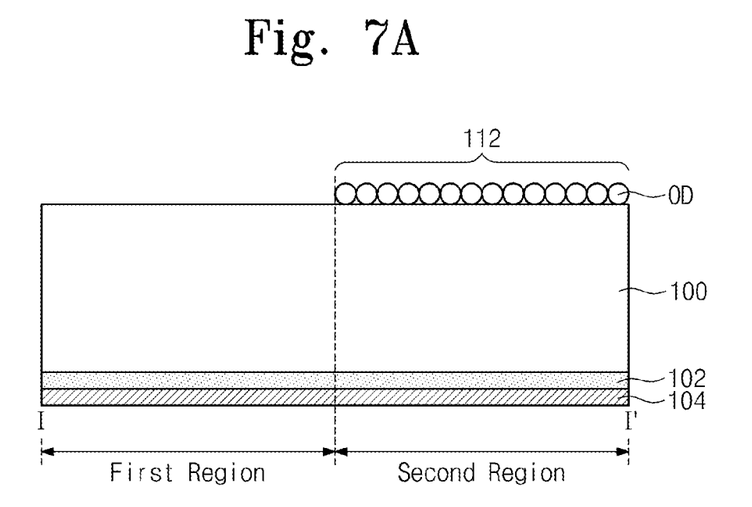
FIGS. 7A and 7B are cross-sectional views illustrating a method of manufacturing a light emitting device according to still other embodiments of the inventive concept.
Figure 7B:
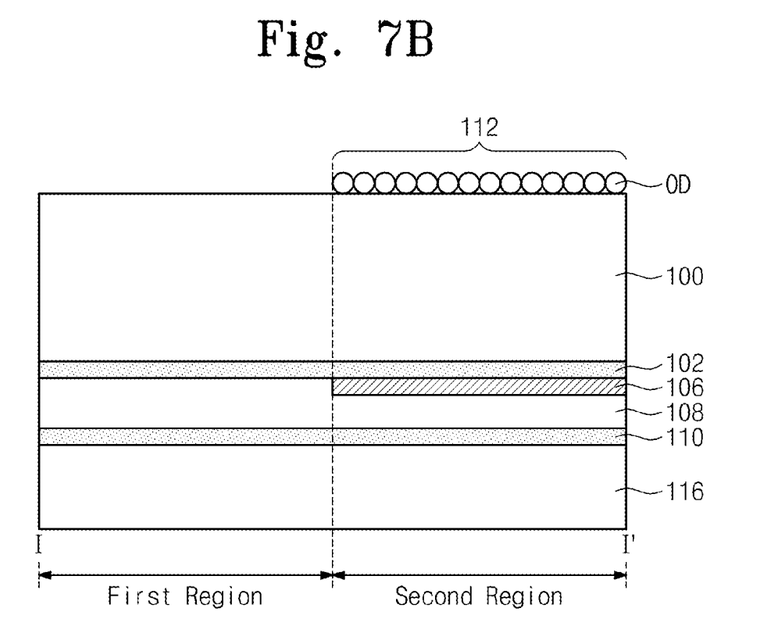

FIGS. 7A and 7B are cross-sectional views illustrating a method of manufacturing a light emitting device according to still other embodiments of the inventive concept.

Referring to FIG. 7A, a first transparent electrode 102 and an assistant electrode layer 140 may be sequentially formed on a first surface of a transparent substrate 100 including a first region corresponding to a light transmission region and a second region corresponding to a light non-transmission region. An optical dispersion layer OD may be adhered to a second surface of the transparent substrate 100. The optical dispersion layer OD may cover the second region. Thus, a light path changing structure 112 including the optical dispersion layer OD may be formed.

Referring to FIG. 7B, the assistant electrode layer 104 may be patterned to form an assistant electrode 106. And then an organic light emitting layer 108, a second transparent electrode 110, and a sealing substrate 116 may be formed. Descriptions thereof may be substantially the same as described with reference to FIGS. 6C and 6D.

According to embodiments of the inventive concept, since the light path changing structure is selectively applied to only the second region in which the assistant electrode 106 is disposed, the light path changing structure may not influence a light-transmittance of the light emitting device. Additionally, the part of the light may be laterally lost by the total reflection may proceed toward the front of the light emitting device by the light path changing structure. Thus, the light output efficiency of the light emitting device may be improved.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of manufacturing a light emitting device, comprising:
   forming a first transparent electrode on a first surface of a transparent substrate including a light transmission region and a light non-transmission region surrounding the light transmission region on substantially a same plane;
   forming an assistant electrode selectively masking the light non-transmission region on the first transparent electrode;
   forming an organic light emitting layer covering the first transparent electrode and the assistant electrode;
   forming a second transparent electrode on the organic light emitting layer; and
   forming a light path changing structure overlapping the assistant electrode in a plane view and selectively masking the light non-transmission region on a second surface of the transparent substrate.

2. The method of claim of claim 1, wherein forming the light path changing structure comprises:
   fixing a detachable micro lens array on a transfer substrate; and
   bonding the micro lens array to the second surface of the transparent substrate in the light non-transmission region.

3. The method of claim 1, wherein forming the light path changing structure comprises:
   selectively etching the second surface of the transparent substrate in the light non-transmission region to form a pattern including concave-curved surfaces.

4. The method of claim 1, wherein forming the light path changing structure comprises:
   forming an optical dispersion layer on the second surface of the transparent substrate in the light non-transmission region.

* * * * *